US010419050B1

(12) United States Patent
Cetinoneri et al.

(10) Patent No.: US 10,419,050 B1
(45) Date of Patent: Sep. 17, 2019

(54) PRINTED CIRCUIT BOARD INTERPOSER FOR RADIO FREQUENCY SIGNAL TRANSMISSION

(71) Applicant: Apple Inc., Cupertino, CA (US)

(72) Inventors: Berke Cetinoneri, Santa Clara, CA (US); James Tsung-Tai Yang, Los Altos, CA (US); William J. Noellert, Los Altos, CA (US); Jyotirmoy Hore, Santa Clara, CA (US); Bradley David Scoles, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/991,911

(22) Filed: May 29, 2018

(51) Int. Cl.
*H03C 1/52* (2006.01)
*H04B 1/18* (2006.01)
*H03H 7/38* (2006.01)
*H03F 3/195* (2006.01)

(52) U.S. Cl.
CPC ............... *H04B 1/18* (2013.01); *H03F 3/195* (2013.01); *H03H 7/38* (2013.01); *H03F 2200/451* (2013.01); *H03H 2007/386* (2013.01)

(58) Field of Classification Search
CPC .............. H04B 1/18; H03F 3/195; H03H 7/38
USPC ........................................................ 455/193.1
See application file for complete search history.

(56) References Cited

U.S. PATENT DOCUMENTS

| | | | | |
|---|---|---|---|---|
| 7,233,061 | B1 * | 6/2007 | Conn | H01L 23/50 257/686 |
| 9,107,300 | B2 | 8/2015 | Kushta | |
| 9,370,103 | B2 | 6/2016 | Yun et al. | |
| 10,090,593 | B2 * | 10/2018 | Chou | H05K 1/141 |

* cited by examiner

*Primary Examiner* — Sonny Trinh
(74) *Attorney, Agent, or Firm* — Feltcher Yoder PC

(57) ABSTRACT

An electronic device may include processing circuitry having a first impedance coupled to a first circuit board, where the electronic device uses the processing circuity to generate one or more radio frequency signals. The electronic device may also include power circuitry to amplify the one or more radio frequency signals, where the power circuitry is coupled to a second circuit board. An interposer may be disposed between the first circuit board and the second circuit board. The interposer may include a via structure having a characteristic impedance to match the first impedance and the second impedance, where the via structure may transmit the one or more radio frequency signals through the interposer between the processing circuitry and the power circuitry.

19 Claims, 13 Drawing Sheets

PRINTED CIRCUIT BOARD INTERPOSER FOR RADIO FREQUENCY SIGNAL TRANSMISSION

BACKGROUND

The present disclosure relates generally to electronic devices, and more particularly, to electronic devices that utilize radio frequency signals, transmitters, and receivers in various processes, such as cellular and wireless device processes.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transmitters and/or receivers are commonly included in various electronic devices, and particularly, portable electronic devices such as, for example, phones (e.g., mobile and cellular phones, cordless phones, personal assistance devices), computers (e.g., laptops, tablet computers), internet connectivity routers (e.g., Wi-Fi routers or modems), radios, televisions, or any of various other stationary or handheld devices. In some embodiments of electronic devices, a transmitter and a receiver are combined to form a transceiver. Certain types of transceivers may be used to generate and receive wireless signals to be transmitted and/or received by way of an antenna coupled to the transceiver. Specifically, the wireless transceiver is generally used to wirelessly communicate voice and/or data over a network channel or other medium (e.g., air) to and from one or more external wireless devices.

Wireless data communication may involve receiving carrier signals (e.g., radio frequency (RF) signals) indicative of the data. Generally, transceivers are installed on a printed circuit board (PCB) with signal processing circuitry associated with processing a carrier signal before and/or after wireless transmission into the air. Having the transceivers and the signal processing circuitry on the same PCB simplifies transmission of the carrier signals for processing before deployment to additional elements of the electronic device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Various embodiments of the present disclosure may be useful in receiving and supporting data signals wirelessly transmitted through radio frequency (RF) signals. By way of example, an electronic device may include a transceiver to transmit and/or receive the RF signals over one or more frequencies of a wireless network. The transmitter may include a variety of circuitry, for example, processing circuitry to modulate a data signal onto a carrier wave to generate an RF signal as well as power circuitry including a power amplifier (e.g., amplifying circuitry) to increase a power level of the RF signal so that it can be effectively transmitted into the air via an antenna. Some electronic devices may have the variety of circuitry of the transceiver disposed on different, stacked PCBs. Thus, the technical challenge of transmitting RF signals from a first PCB of the stacked PCBs to a second PCB may arise. These electronic devices may include an interposer between the first PCB and the second PCB to facilitate in transmitting RF signals between the stacked PCBs, for example, from the processing circuitry disposed on the first PCB to the power circuitry disposed on the second PCB. Certain considerations may be made regarding the design of the interposer to match a particular impedance of a source of the RF signal transmitting through the interposer, for example, by selecting a via design for the interposer, whereby through matching the impedance of the RF signal source, efficient RF signal transmission may occur between the stacked PCBs.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
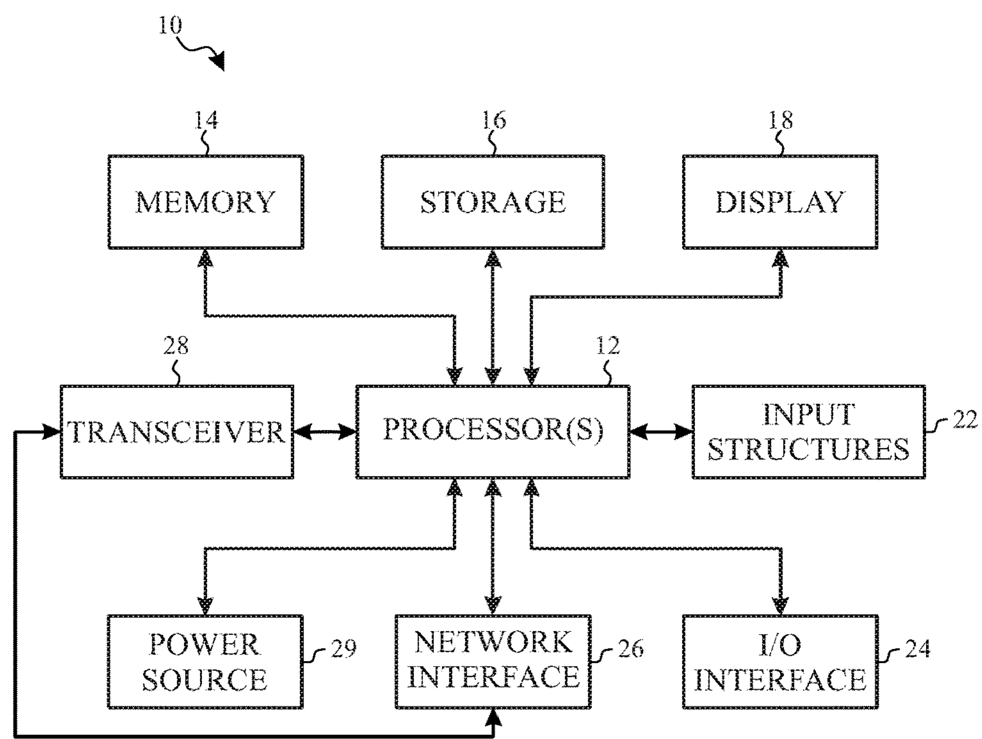
FIG. 1 is a schematic block diagram of an electronic device including a transceiver, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Embodiments of the present disclosure generally relate to a transceiver of an electronic device that receives and/or transmits wireless data signals, such as radio frequency (RF) signals. In certain embodiments, the transceiver may include RF circuitry (e.g., Wi-Fi and/or LTE RF circuitry, front end circuitry) that is used, for example, to support transmission and/or reception of RF signals that follow various wireless communication standards or additional communication standards. It may be desirable to separate transceiver circuitry onto different printed circuit boards (PCBs) to conserve space for use in smaller electronic devices. As such, it may prove difficult to transmit carrier signals and/or other radio frequency signals between the different PCBs.

The electronic devices discussed herein may include certain transceiver circuitry (e.g., modulation/demodulation circuitry of the transmitter/receiver) on a first PCB and certain other transceiver circuitry (e.g., power circuitry, power amplifier) on a second PCB, and where the first PCB and the second PCB may be stacked to conserve space and/or decrease a footprint of the PCBs. However, this stacking may create a challenge of transmitting RF signals between the PCBs while maintaining characteristics of the RF signal. A design for a RF via is described herein to facilitate RF signal transmission between stacked PCBs. Using techniques described herein to select an interposer and a RF via design may facilitate transmitting RF signals between stacked PCBs. With the foregoing in mind, a general description of suitable electronic devices that may include such a transceiver is provided below.

Turning first to FIG. 1, an electronic device 10 according to an embodiment of the present disclosure may include, among other things, one or more of processor(s) 12, memory 14, nonvolatile storage 16, a display 18, input structures 22, an input/output (I/O) interface 24, a network interface 26, a transceiver 28, and a power source 29. The various functional blocks shown in FIG. 1 may include hardware elements (including circuitry), software elements (including computer code stored on a computer-readable medium) or a combination of both hardware and software elements. It should be noted that FIG. 1 is merely one example of a particular embodiment and is intended to illustrate the types of elements that may be present in the electronic device 10.

Figure 2:
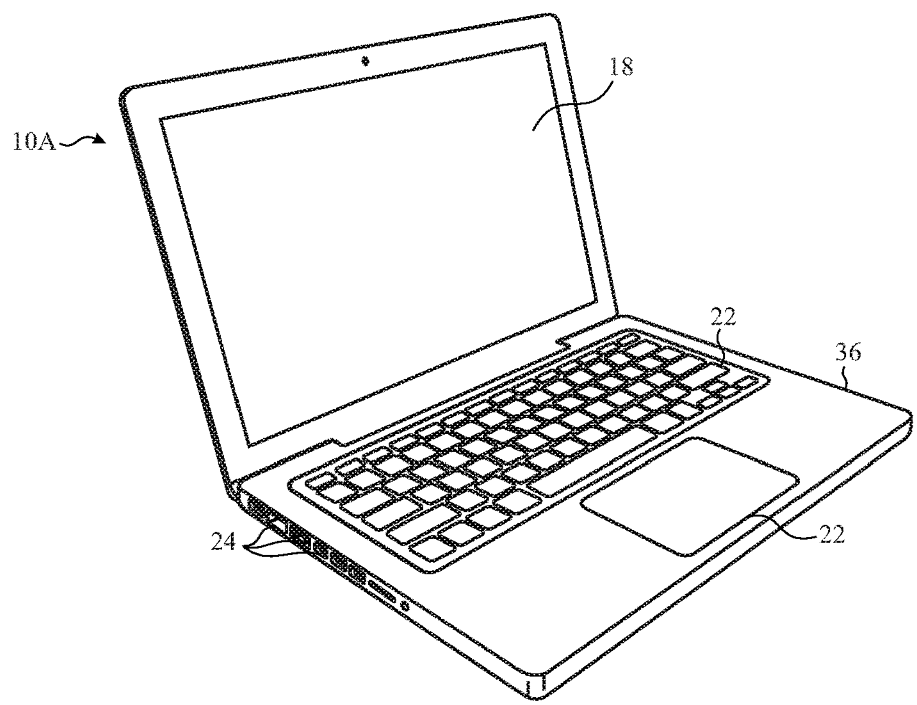
FIG. 2 is a perspective view of a notebook computer representing a first embodiment of the electronic device of FIG. 1.
Figure 3:
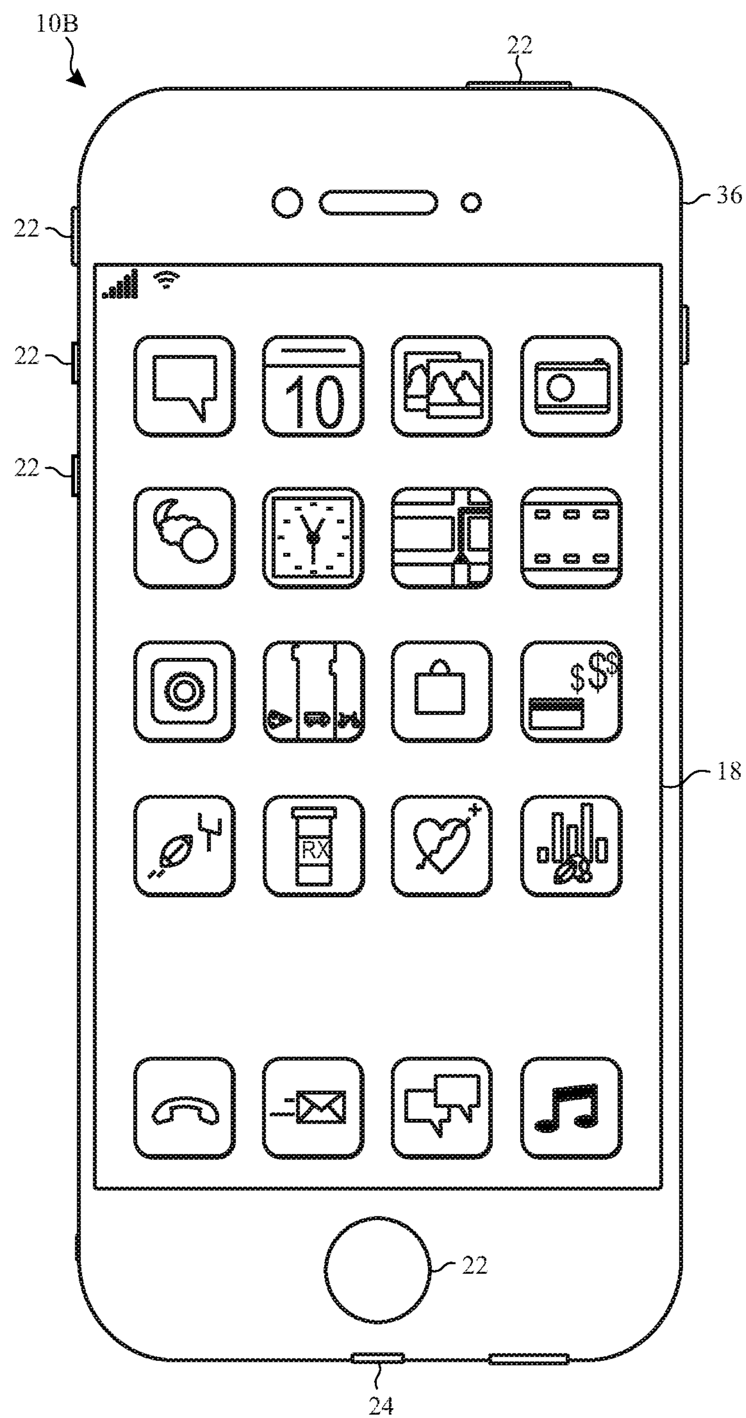
FIG. 3 is a front view of a hand-held device representing a second embodiment of the electronic device of FIG. 1.
Figure 4:
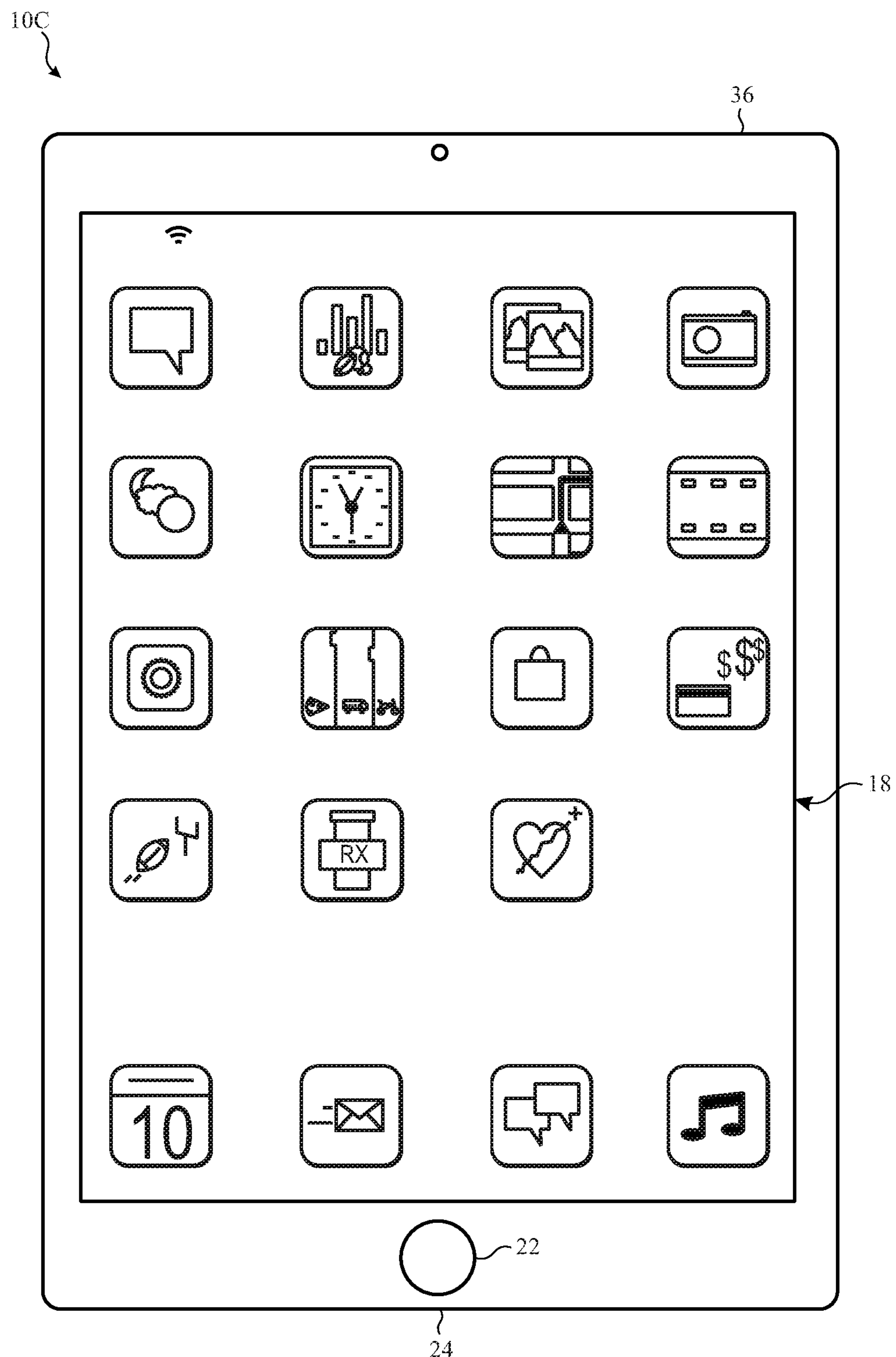
FIG. 4 is a front view of another hand-held device representing a third embodiment of the electronic device of FIG. 1.
Figure 5:
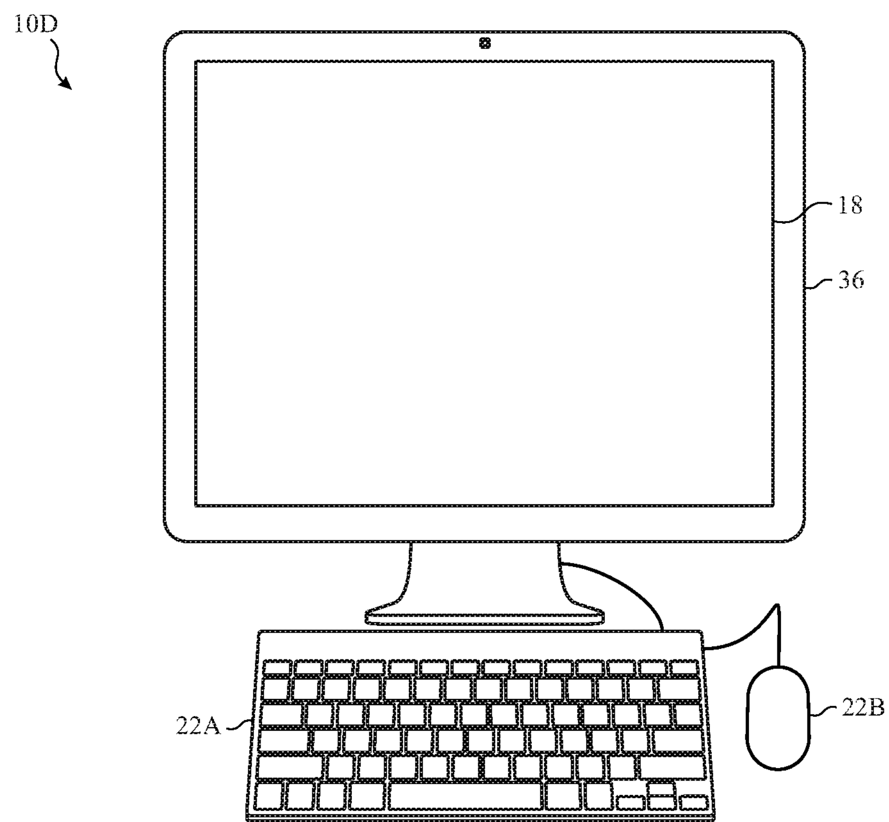
FIG. 5 is a front view of a desktop computer representing a fourth embodiment of the electronic device of FIG. 1.
Figure 6:
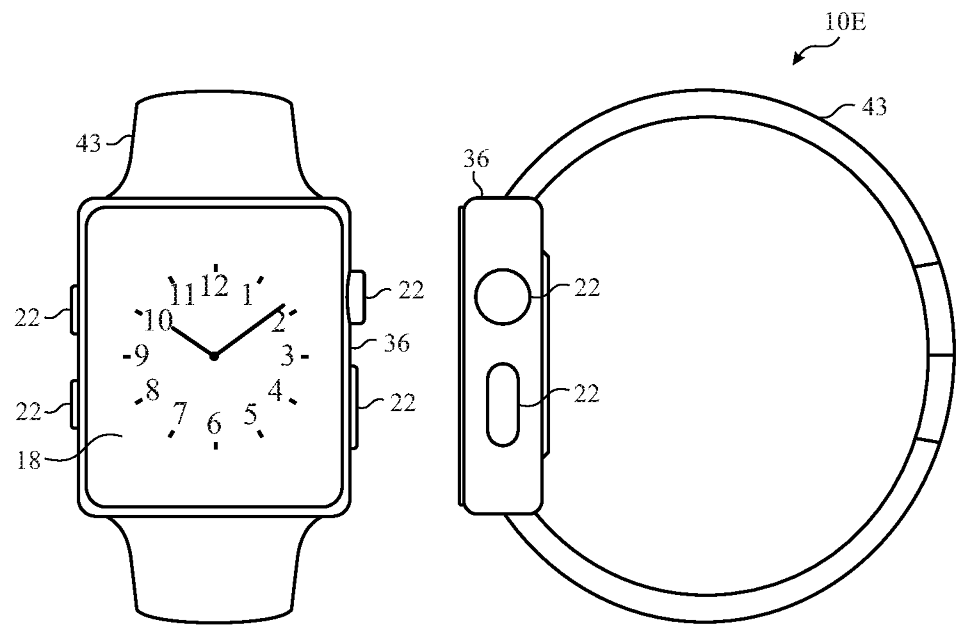
FIG. 6 is a front view and side view of a wearable electronic device representing a fifth embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may operably couple with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or processes, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions executable by the processor(s) 12 to enable the electronic device 10 to provide various functionalities.

In certain embodiments, the display 18 may be a liquid crystal display (LCD), which may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level).

The I/O interface 24 may enable the electronic device 10 to interface with various other electronic devices, as may the network interface 26. The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3$^{rd}$ generation (3G) cellular network, 4$^{th}$ generation (4G) cellular network, long term evolution (LTE) cellular network, or long term evolution license assisted access (LTE-LAA) cellular network. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra wideband (UWB), alternating current (AC) power lines, and so forth.

In some embodiments, the electronic device 10 communicates over the aforementioned wireless networks (e.g., Wi-Fi, WiMAX, mobile WiMAX, 4G, LTE, and so forth) using the transceiver 28. The transceiver 28 may include circuitry useful in both wirelessly receiving and wirelessly transmitting signals (e.g., data signals, wireless data signals, wireless carrier signals, RF signals), such as a transmitter and/or a receiver. Indeed, in some embodiments, the transceiver 28 may include a transmitter and a receiver combined into a single unit, or, in other embodiments, the transceiver 28 may include a transmitter separate from a receiver. The transceiver 28 may transmit and receive RF signals to support voice and/or data communication in wireless applications such as, for example, PAN networks (e.g., Bluetooth), WLAN networks (e.g., 802.11x Wi-Fi), WAN networks (e.g., 3G, 4G, and LTE and LTE-LAA cellular networks), WiMAX networks, mobile WiMAX networks, ADSL and VDSL networks, DVB-T and DVB-H networks, UWB networks, and so forth. As further illustrated, the electronic device 10 may include the power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. of Cupertino, Calif. By way of example, the electronic device 10, taking the form of a notebook computer 10A, is illustrated in FIG. 2 in accordance with one embodiment of the present disclosure. The notebook computer 10A may include a housing or the enclosure 36, the display 18, the input structures 22, and ports associated with the I/O interface 24. In one embodiment, the input structures 22 (such as a keyboard and/or touchpad) may enable interaction with the notebook computer 10A, such as starting, controlling, or operating a graphical user interface (GUI) and/or applications running on the notebook computer 10A. For example, a keyboard and/or touchpad may facilitate user interaction with a user interface, GUI, and/or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include the enclosure 36 to protect interior elements from physical damage and to shield them from electromagnetic interference. The enclosure 36 may surround the display 18. The I/O interface 24 may open through the enclosure 36 and may include, for example, an I/O port for a hard wired connection for charging and/or content manipulation using a standard connector and protocol, such as the Lightning connector provided by Apple Inc. of Cupertino, Calif., a universal service bus (USB), or other similar connector and protocol.

The input structures 22, in combination with the display 18, may enable user control of the handheld device 10B. For example, the input structures 22 may activate or deactivate the handheld device 10B, navigate a user interface to a home screen, present a user-editable application screen, and/or activate a voice-recognition feature of the handheld device 10B. Other of the input structures 22 may provide volume control, or may toggle between vibrate and ring modes. The input structures 22 may also include a microphone to obtain a user's voice for various voice-related features, and a speaker to enable audio playback and/or certain phone capabilities. The input structures 22 may also include a headphone input to provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. of Cupertino, Calif. It should be noted that the computer 10D may also represent a personal computer (PC) by another manufacturer. The enclosure 36 may protect and enclose internal elements of the computer 10D, such as the display 18. In certain embodiments, a user of the computer 10D may interact with the computer 10D using various peripheral input devices, such as keyboard 22A or mouse 22B (e.g., input structures 22), which may operatively couple to the computer 10D.

Similarly, FIG. 6 depicts a wearable electronic device 10E representing another embodiment of the electronic device 10 of FIG. 1. By way of example, the wearable electronic device 10E, which may include a wristband 43, may be an Apple Watch® by Apple, Inc. of Cupertino, Calif. However, in other embodiments, the wearable electronic device 10E may include any wearable electronic device such as, a wearable exercise monitoring device (e.g., pedometer, accelerometer, heart rate monitor), or other device by another manufacturer. The display 18 of the wearable electronic device 10E may include a touch screen version of the display 18 (e.g., LCD, OLED display, active-matrix organic light emitting diode (AMOLED) display, and so forth), as well as the input structures 22, which may facilitate user interaction with a user interface of the wearable electronic device 10E.

Figure 7:
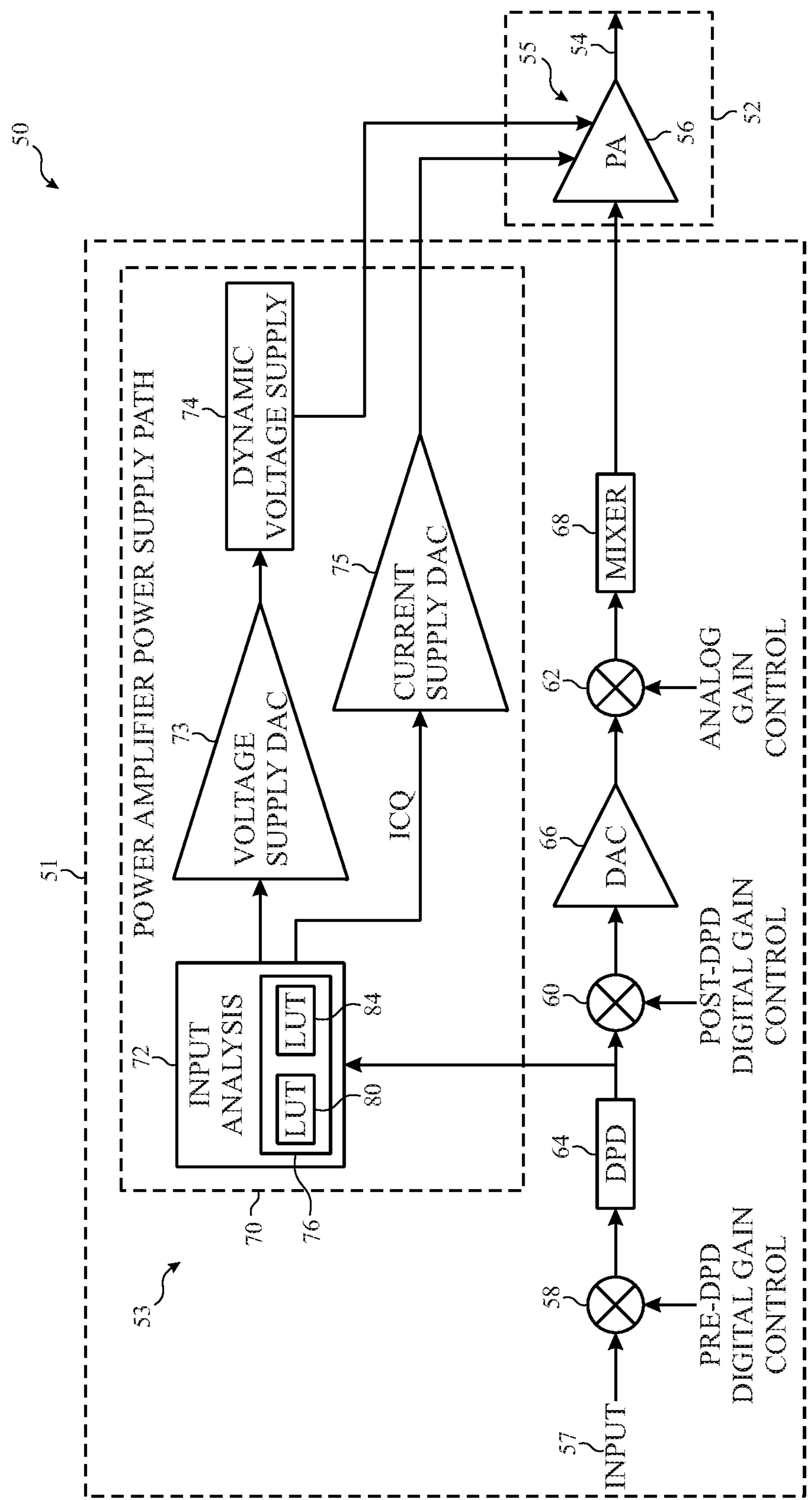
FIG. 7 is a schematic block diagram of a transmitter of the transceiver of FIG. 1, in accordance with an embodiment.

In certain embodiments, as previously noted above, each embodiment (e.g., notebook computer 10A, handheld device 10B, handheld device 10C, computer 10D, and wearable electronic device 10E) of the electronic device 10 may include the transceiver 28. With the foregoing in mind, FIG. 7 depicts a schematic block diagram of an embodiment of a transmitter 50 within transceiver 28. In the illustrated embodiment, the transmitter 50 is separate from the receiver within the transceiver 28, but in some embodiments, the transceiver 28 may include a transmitter 50 and a receiver combined into a single unit. Further, the various functional blocks shown in FIG. 7 may include hardware elements (including circuitry), software elements (including computer code stored on a computer-readable medium) or a combination of both hardware and software elements. It should also be noted that FIG. 7 is merely one example of a particular implementation and is intended to illustrate the types of components that may be present in the transmitter 50. As such, functional blocks may be added or omitted, and their arrangement within the transmitter 50 may be modified.

In this example, circuitry of the transmitter 50 may be arranged onto two or more PCBs. As depicted, the transmitter 50 is functionally separated onto a first PCB 51 and a second PCB 52. The first PCB 51 may be stacked on top of the second PCB 52, or vice versa. Here, signal processing components 53 are disposed on the first PCB 51 and power components 55 are disposed on the second PCB 52. Since many RF systems are designed to have about 50Ω impedance, the running examples in this disclosure assume that the components on each PCB 51 and 52 have this impedance.

In some embodiments, the transmitter 50 may receive an input signal 57 that, after some modifications, may be transmitted wirelessly via an antenna (not shown) operably connected to an output 54 of the power amplifier (PA) 56. The transmitter 50 may regulate power supplied to the power amplifier 56 according to average power tracking of the modified input signal 57 or envelope tracking of the input signal 57. The transmitter 50 receives a digital data signal as the input signal 57, and upon modification and amplification, outputs a RF signal carrying the digital data via the output 54. As such, the output amplified signal may include a single baseband signal or multiple component carriers (e.g., baseband signals). That is, the output amplified RF signal may include a single signal or a multiple signals aggregated into one or more frequency bands.

Before transmission of the output signal, a pre-digital pre-distortion (pre-DPD) digital gain control 58 may apply a gain to the input signal 57. The pre-DPD digital gain control 58, as well as other gain control elements (e.g., post-DPD digital gain control 60 and analog gain control 62) in the transmitter 50 may apply gain to a signal so that the amplitude of an output signal of the gain control element is within a suitable operating range of the circuitry that may receive the output signal of the gain control element as an input. As such, the digital pre-distortion (DPD) block 64 may apply distortion to the output of the pre-DPD digital gain control 58 to offset distortion the power amplifier 56 may introduce. That is, the DPD block 64 may introduce distortion intended to have the opposite effect on the signal compared to the distortion the power amplifier 56 may introduce. The output of the DPD block 64 may have additional gain applied to it by a post-DPD digital gain control 60. A digital-to-analog converter (DAC) 66 may convert the output of the post-DPD digital gain control 60 from a digital to an analog signal to prepare the signal for transmission across an analog channel (e.g., air). An analog gain control 62 may apply an analog gain to the analog signal output from the DAC 66. A mixer 68 may receive an output of the analog gain control 62 as an input and adjust (e.g., shift) the frequency of the signal to a suitable frequency for the channel the signal will be transmitted on. The mixer 68 may additionally or alternatively perform frequency modulation (FM) or amplitude modulation (AM) to modify the frequency or amplitude of the signal, respectively. The output of the mixer 68 may feed into an input of the power amplifier 56 for amplification so that the signal transmitted at the output 54 is suitable for transmission across a channel.

Further, in some embodiments, to control the power supplied to the power amplifier 56, the transmitter 50 may contain a power amplifier power supply path 70. The power amplifier power supply path 70 may include input analysis block 72, a voltage supply DAC 73, a dynamic voltage supply 74, a current supply DAC 75 and/or the like. The input analysis block 72 may receive an input signal, such as input signal 57 or the output of the DPD block 64, as illustrated, and may output one or more signals suitable to adjust the power (e.g., current and/or voltage) supplied to the power amplifier 56 based at least in part on one or more characteristics (e.g., amplitude, envelope, and/or the like) of the input signal. That is, in some embodiments, the input analysis block 72 may generate one or more signals to set the quiescent current (ICQ) (e.g., no-load collector current) and/or the voltage supplied to the power amplifier 56, which alone or in combination may govern the power supplied to the power amplifier 56. To do so, the input analysis block 72 may contain one or more look up tables (LUTs) 76 that map input signal characteristics to suitable power amplifier 56 power supplies. In this embodiment, a set of LUTs 76 may each contain a LUT related to regulating power supplied based on average power tracking (e.g., 80) and a LUT related to regulating power supplied based on envelope tracking (e.g., 84). Example implementations of regulating the power supply based on average power tracking and/or envelope tracking are described in more detail in U.S. patent application Ser. No. 15/951,946, the contents of which are hereby incorporated by reference in their entirety for all purposes.

Indeed, as depicted, the transmitter 50 includes signal processing components 53, such as the modulating and gain control circuitry, described above, on the first PCB 51 and includes power components 55, such as the power amplifier 56 on the second PCB 52. In some embodiments, these PCBs 51 and 52 are stacked, for example, the second PCB 52 is stacked on the first PCB 51. Where the transmitter 50 is functionally divided between PCBs 51 and 52, communicating RF signals from the signal processing components 53 disposed on the first PCB 51 to the power components 55 disposed on the second PCB 52 may pose challenges because RF signals need to be communicated between the PCBs 51 and 52 through structures not typically designed to transmit RF signals (e.g., vias). To address this issue, RF vias have been designed to have a characteristic impedance to match a source impedance and a load impedance so that these RF vias may transmit RF signals between a first PCB 51 and a second PCB 52. For example, where RF signals are transmitted from the signal processing components 53 on the first PCB 51 to the power components 55 on the second PCB 52, the signal processing components 53 would be the source and the power components would be the load. In this example, both are assumed to be 50Ω. Designing a structure to "match" a source and load impedance creates a structure having an impedance to enable maximum signal transfer to occur with minimum reflections thereby creating an efficient transmission system. Quantifying transmission system efficiency through measuring an input return loss may help evaluate designs of a RF via because input return loss compares power transmitted to power reflected to determine a relative amount of power successfully transmitted of the RF signal.

Figure 8:
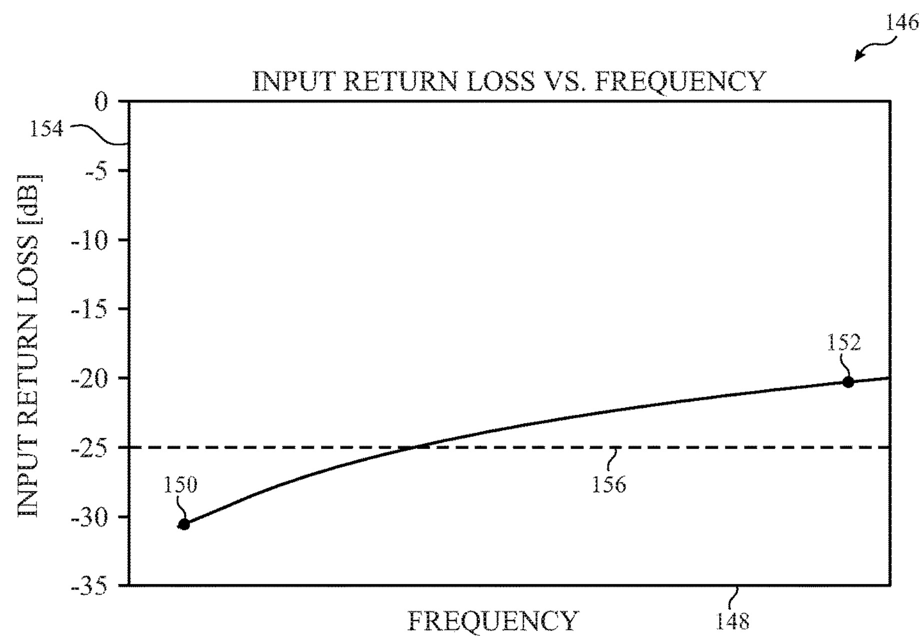
FIG. 8 is a graph illustrating how changes in frequency of a radio frequency (RF) signal may affect input return loss such as transmitted within the electronic device of FIG. 1, in accordance with an embodiment.

With the foregoing in mind, FIG. 8 depicts a graph 146 illustrating an example of how changes in RF signal frequency can affect input return loss during transmission through a RF via. The graph 146 includes a frequency axis 148 having increasing frequencies from the origin of the plot, such that a frequency at a point 150 is numerically lower (e.g., corresponding to a signal with a larger period) than a frequency at a point 152. The graph 146 also includes an input return loss axis 154 indicative of an input return loss magnitude in a decibel scale, where an input return loss at the point 150 is lower than an input return loss at the point 152.

In a given RF transmission system (e.g., the electronic device 10), an acceptable level of input return loss may be identified. On the graph 146, level 156 indicates an acceptable level of input return loss (e.g., a target input return loss level) for the example RF via. For example, in the electronic device 10, an acceptable level of input return loss may be −25 dB or less. The level 156 may further indicate if a particular combination of a transmission frequency and a particular RF via design is an acceptable combination. For example, a frequency corresponding to an input return loss at or below the level 156 may correlate to an acceptable amount of input return loss (e.g., the point 150), while the input return loss above the level 156 may correlate to an unacceptable amount of input return loss (e.g., the point 152). Equation 1 may relate the characteristic impedance for a transmission line with an input return loss associated with the RF transmission system.

$$\Gamma_{in} = \frac{Z_s - Z_o}{Z_s + Z_o} \quad [1]$$

Equation 1 shows the input return loss ($\Gamma_{in}$) as equal to a ratio between a difference between a determined RF source impedance ($Z_s$) and a characteristic impedance ($Z_o$) of a transmission line and a sum of $Z_s$ and $Z_o$. Matching the characteristic impedance of the transmission line to the RF source and load impedance may cause the input return loss to remain at or below a target level for the RF transmission system, where a perfect match (e.g., source impedance equals characteristic impedance) may cause the input return loss to trend infinitely negative (e.g., at or below the target level).

As may be clear from discussions concerning FIG. 8, RF signal transmission is generally more complex than signal transmission of other signals used in the electronic device 10. For example, when transmitting a voltage signal indicative of binary data, system designers may give little or no attention to RF source impedances or transmission line impedances. However, if RF signals transmit through materials or structures not designed for RF signal transmission, RF signals may significantly attenuate. Thus, to facilitate RF signal transmission between stacked PCB layers, RF vias and/or interposers may be designed specifically to promote RF signal transmission.

Figure 9A:
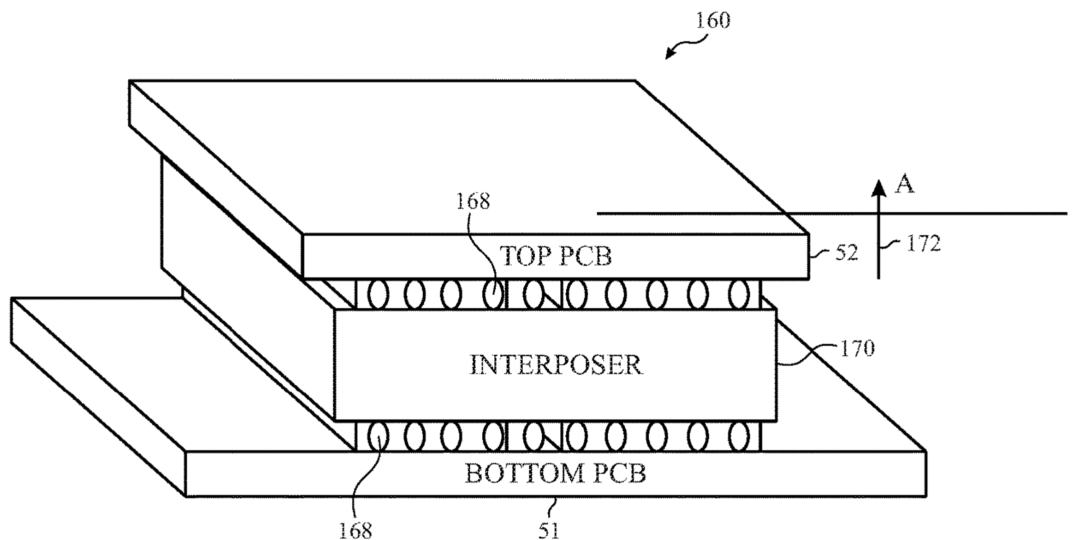
FIG. 9A is a perspective view of a stacked printed circuit board (PCB) arrangement for the transceiver of FIG. 1, where processing circuitry of the transceiver is disposed on a first PCB and where power circuitry of the transceiver is disposed on a second PCB, in accordance with an embodiment.

Keeping this in mind, FIG. 9A is a perspective view of a stacked PCB 160 of the electronic device 10 having the signal processing components 53 disposed on the first PCB 51 and the power components 55 disposed on the second PCB 52. Solder balls 168, or any other suitable method, may be used to secure the first PCB 51 and the second PCB 52 to an interposer 170, as well as to provide electrical connections. The interposer 170 may include materials and/or structures designed for RF signal transmission. For example, the interposer 170 may include RF vias coupling between the signal processing components 53 and the power components 55 for RF signal transmission.

Tracing transmission directions between the stacked PCB 160, the signal processing components 53 may transmit the RF signals through the interposer 170 in the direction of arrow 172 to the power amplifier 56. Upon reception of the RF signals, the power amplifier 56 may increase the RF signal amplitude (e.g., increasing power level of the RF signal) to prepare the RF signals for emission via an antenna.

Figure 9B:
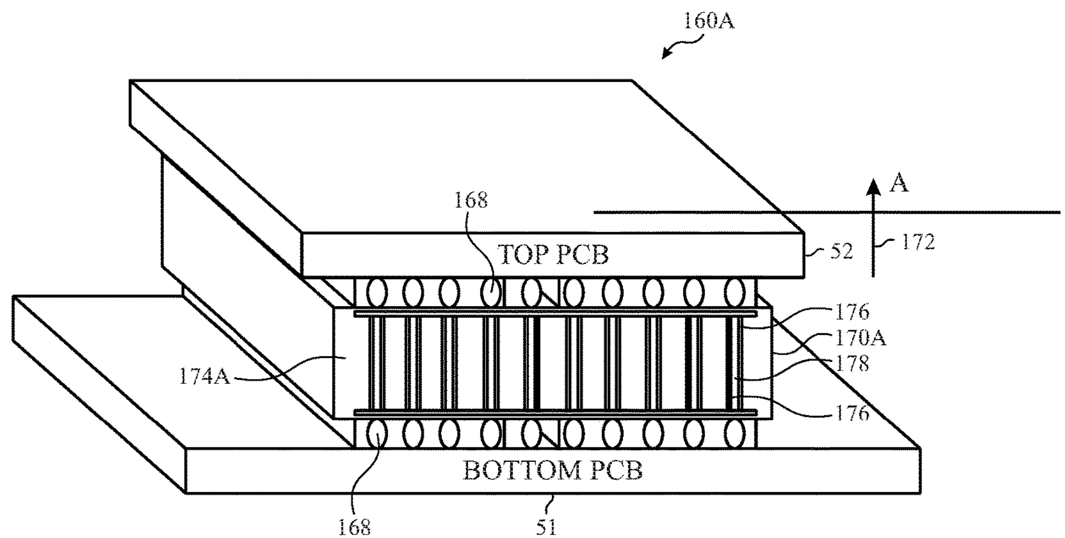
FIG. 9B is a perspective view of the stacked PCB of FIG. 9A having vias for transmitting RF signals between the first and second PCBs according to a first embodiment of the interposer of FIG. 9A.
Figure 9C:
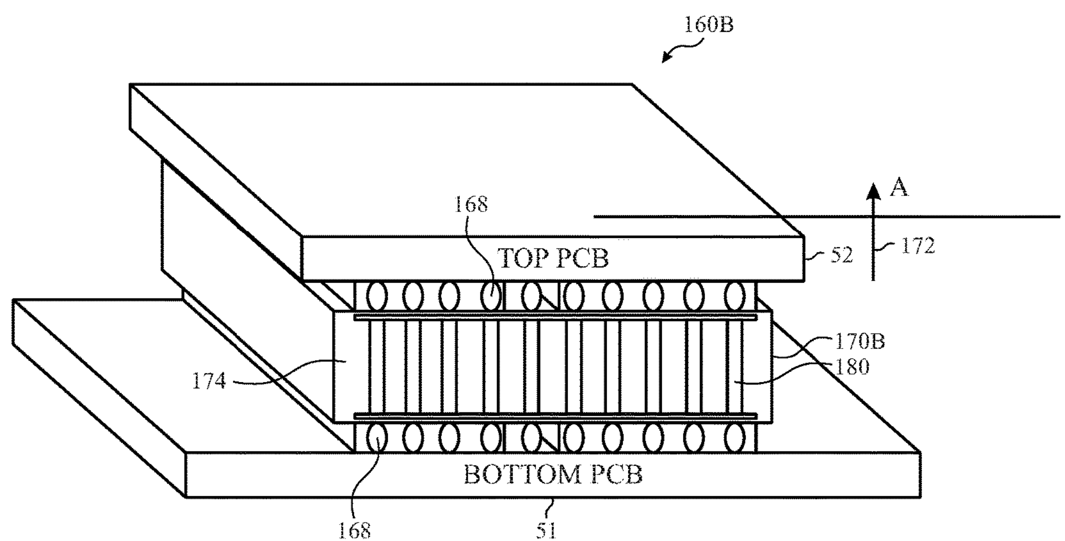
FIG. 9C is a perspective view of the stacked PCB of FIG. 9A having vias for transmitting RF signals between the first and second PCBs according to a second embodiment of the interposer of FIG. 9A.

As described above, the interposer 170 may include RF vias designed for transmitting RF signals between circuitry disposed on different layers of the stacked PCB 160. A first embodiment of the interposer 170A is shown in FIG. 9B and a second embodiment of the interposer 170B is shown in FIG. 9C. The first embodiment of the interposer 170A includes RF vias having a conductive coating and a non-conductive filling (e.g., a filling for the via made from a non-conductive material), while the second embodiment of the interposer 170B includes RF vias having a conductive filling.

FIG. 9B is a perspective view of a first embodiment of FIG. 9A showing the interposer 170A with RF vias 174A disposed between the first PCB 51 and the second PCB 52. The RF vias 174A may include side walls with a conductive coating 176 (e.g., copper) and a non-conductive filling 178 (e.g., epoxy, resin). The conductive coating 176 may vary in thickness and material between embodiments to cause conduction of RF signals. In some embodiments, a copper coating of a thickness of 20 μm may be suitable for RF signal conduction. By selecting the coating, a thickness of the interposer 170A, a material of the interposer 170A, and a diameter for the RF vias 174A, the interposer 170A may be designed to have a characteristic impedance to match a source impedance. Through selecting these design parameters, the interposer 170A and RF vias 174A may approximate a coaxial transmission line having a central conducting RF via (e.g., ungrounded) and two adjacent grounded RF vias acting to shield the transmitted RF signal from signal interference of nearby transmitted RF signals by other central conducting RF vias. Similar to RF signal transmission via coaxial transmission lines, interposer 170A, and RF via 174A design may be adjusted to approximate a coaxial transmission line having a characteristic impedance, such as 50Ω, that balances out (e.g., matches) the source impedance transmitting the RF signal and the load impedance receiving the RF signal.

FIG. 9C is a perspective view of a second embodiment of FIG. 9A having the RF vias 174B in the second embodiment of the interposer 170B disposed between the first PCB 51 and the second PCB 52. Many features of the interposer 170B are similar to the embodiment described in FIG. 9A, for example, a thickness of the interposer 170B, a material of the interposer 170B, and a diameter for the RF vias 174B are selected to design the interposer 170B to facilitate RF signal transmission between the first PCB 51 and the second PCB 52. In this embodiment, however, the RF vias 174B include a conductive filling 180 (e.g., copper). The conductive filling 180 may use the same material as the conductive coating 176 material. A conductive filling 180 may be used over the conductive coating 176 to improve signal integrity of the transmitted RF signals, enabled by an improved and/or more complete electrical coupling (e.g., filling vs coating to cause the electrical coupling).

The RF vias 174A and 174B of FIG. 9B and FIG. 9C may be formed through typical via formation processes in a substrate of the interposer 170A and 170B. For example, a substrate may have via holes drilled through the substrate in a dielectric material. Upon drilling, vias may be coated or filled with conductive material, like copper. Once the conductive layer or filling is finalized, operable couplings at a first opening and at a second opening of the vias are created where appropriate per the embodiment. Other suitable techniques may also be used to create the RF vias 174 structure.

Figure 10:
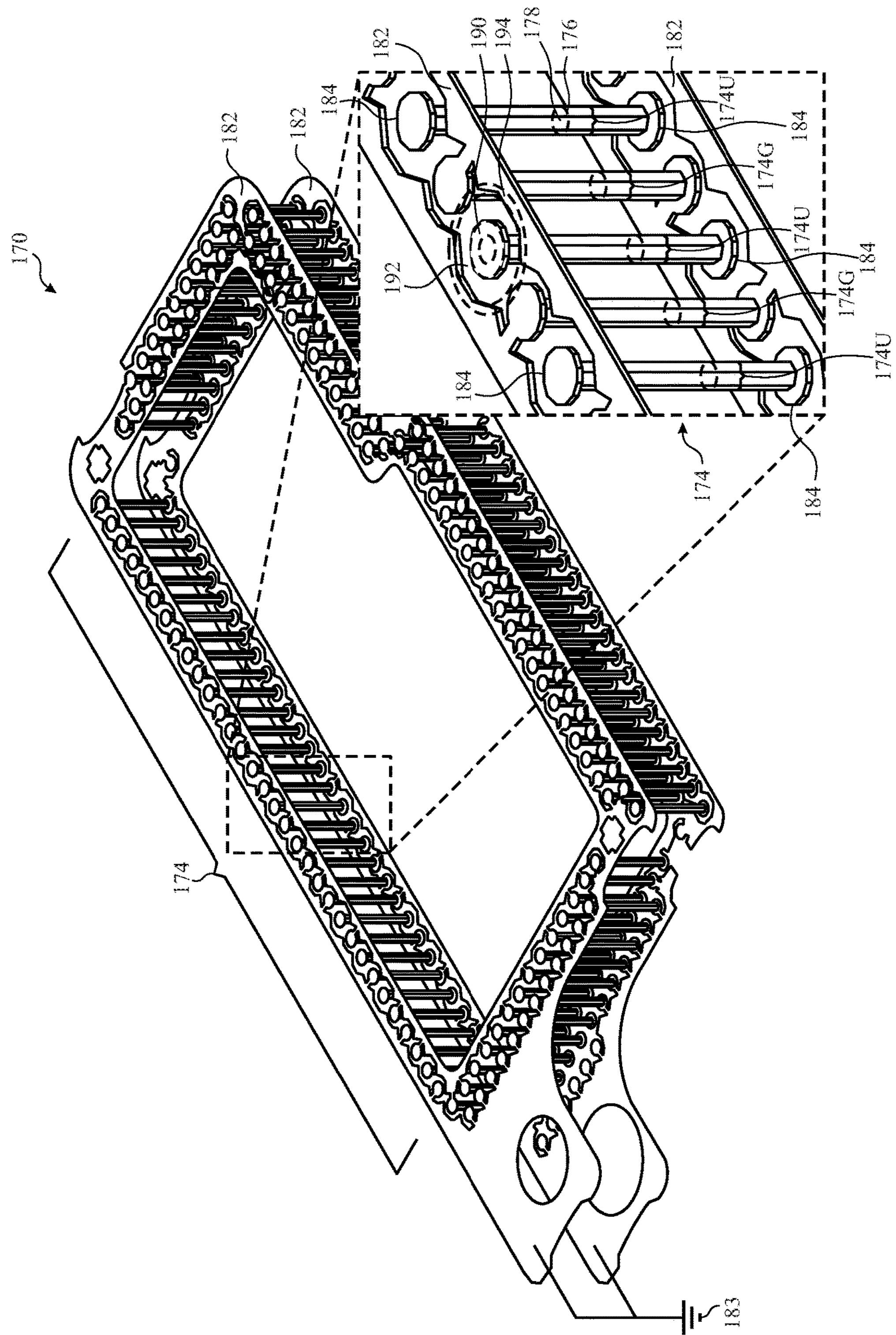
FIG. 10 is a perspective view of the vias of the interposer of FIG. 9A, in accordance with the first embodiment.

To further elaborate on the interposer 170 structure, FIG. 10 is a perspective view of the interposer 170 shown having the RF vias 174. The interposer 170 may use a RF via 174 structure with the conductive coating 176 and the non-conductive filling 178, as described above, although the RF vias 174 may alternatively be filled with the conductive filing 180 (e.g., embodiments described in FIG. 9C) in the place of the conductive coating 176 and the non-conductive filing 178 (e.g., embodiments described in FIG. 9B). As is depicted, the interposer 170 may have a perimeter-focused geometry. It is noted that specific arrangements of the interposer 170 may also take a variety of additional shapes and/or geometries and should not be limited to a perimeter-focused geometry.

The interposer 170 may include one or more grounded layers 182 and one or more couplings 184. As depicted in FIG. 10, there are two grounded layers 182. The one or more grounded layers 182 may electrically couple to a common ground 183 voltage, for example, through a side coupling disposed in a same plane as the one or more grounded layers 182 coupling the coupling 184 associated with a RF via 174 to a grounded layer 182. The one or more grounded layers 182 may conductively couple to a subset of the RF vias 174. The subset of the RF vias 174 that couple to the one or more grounded layers 182 may each be referred to as a grounded RF via 174G. The subset of the RF vias 174 that couple to the power components 55 and the signal processing components 53 may each be referred to as an ungrounded RF via 174U. The combination of an ungrounded RF via 174U flanked by two grounded RF vias 174G may mimic a coaxial transmission line and enable the RF vias 174 to transmit RF signals.

To elaborate, a coaxial transmission line may include elements similar to an inner conductor 190, a dielectric material 192 surrounding the inner conductor 190, and a shielded (e.g., grounded) conductor 194 surrounding the dielectric material 192. The inner conductor 190 may parallel the conductive coating 176 of the ungrounded RF via 174U, the dielectric material 192 surrounding the inner conductor 190 may parallel a dielectric material of the interposer 170, and the shielded conductor 194 may parallel a grounded outer boundary formed through a generalized grouping of the one or more grounded layers 182 and two of the grounded RF via 174G. Furthermore, similar to a coaxial transmission line, the interposer 170 may be designed to meet particular transmission characteristics of the electronic device 10. In particular, the interposer 170 design may have a characteristic impedance to match a source impedance.

Figure 11:
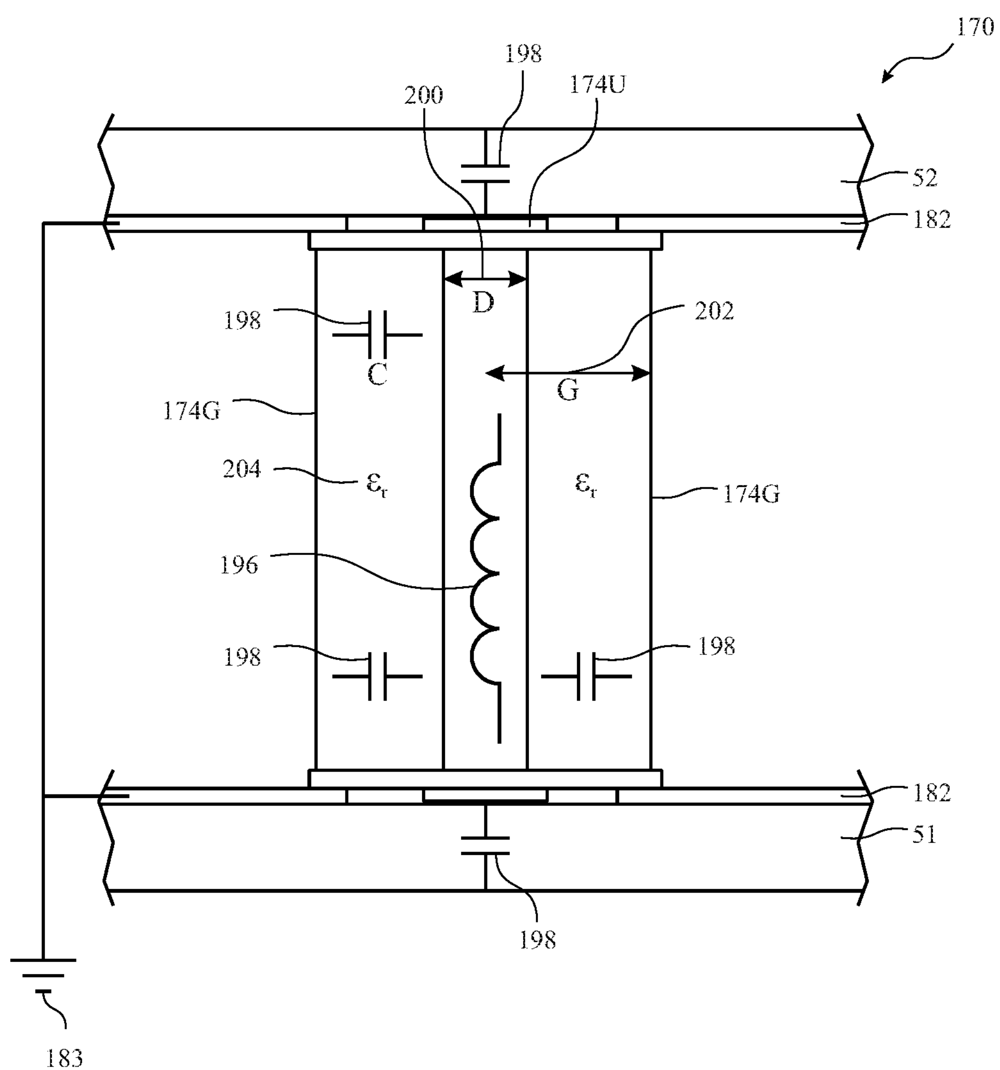
FIG. 11 is a schematic side view of a via of the interposer of FIG. 9A, in accordance with the first embodiment.

To explain such design considerations, FIG. 11 is a schematic side view of the interposer 170 including an ungrounded RF via 174U coupled between the first PCB 51 and the second PCB 52, and located adjacent to two of the grounded RF vias 174G, not illustrated. Design parameters to consider while designing an interposer 170 may include via inductance 196 (represented by an L and an inductor), parasitic capacitances 198 (represented by a capacitor and/or a C), via diameter 200 (represented by a D), a distance 202 to adjacent grounded plating and/or grounded conductor of an adjacent via (represented by a G), and a material constant 204 (represented by Er of a material of the interposer 170). These described design parameters may change a design and/or a characteristic impedance of the RF vias 174.

Adjusting a characteristic impedance associated with the interposer 170 may depend at least in part on the distance 202, the material constant 204, and the via diameter 200. During a design phase, certain design parameters may be held constant and certain parameters may be varied to find an appropriate design for achieving a particular characteristic impedance (e.g., a matching characteristic impedance) associated with the interposer 170. When determining the characteristic impedance of a particular combination of design parameters, the following equation may be used:

$$Z_o = 60\sqrt{\frac{\mu_r}{\varepsilon_r}}\ln\left(\frac{2G}{D}\right) \qquad [2]$$

Where Equation 2 shows the characteristic impedance ($Z_o$) as a function of the material constant 204 ($\mu_r$, $\varepsilon_r$), the via diameter 200 (D), and the distance 202 (G) to one or more grounded layers 182 and/or grounded conductor of an adjacent via from the center axis of the ungrounded RF via 174U. It is noted for the material constant 204, the parameters ($\mu_r$, $\varepsilon_r$) take into account a relative permittivity of the material and a magnetic permeability of the material. In either case, these values included in the material constant 204 are material-specific and/or known values. Ultimately, through varying parameters of Equation 2, a design of the interposer 170 may create a characteristic impedance to match a RF source impedance, such as 50Ω.

When the characteristic impedance matches the source impedance, the RF vias 174 may efficiently transmit electromagnetic fields associated with the RF signals through the interposer 170. The electromagnetic fields may transmit in an area between respective of the RF vias 174 (e.g., between a grounded RF via 174G and an ungrounded RF via 174U) to approximate electromagnetic transmission within a coaxial transmission line.

As described above, designs of the interposer 170 may vary for different material constants 204, via diameters 200, and distances 202 to create different characteristic impedances. In some embodiments, designs may vary in a number of grounded layers 182. Changing the number of grounded layers 182 of the interposer 170 may improve shielding of the transmitted RF signal within the interposer 170 from signal interference, for example, signal leakage from adjacently transmitted RF signals. As the number of grounded layers 182 increases, the RF vias 174 are further encased by the grounded layers 182, acting to increasingly isolate RF signals transmitted via ungrounded RF vias 174U.

Figure 12:
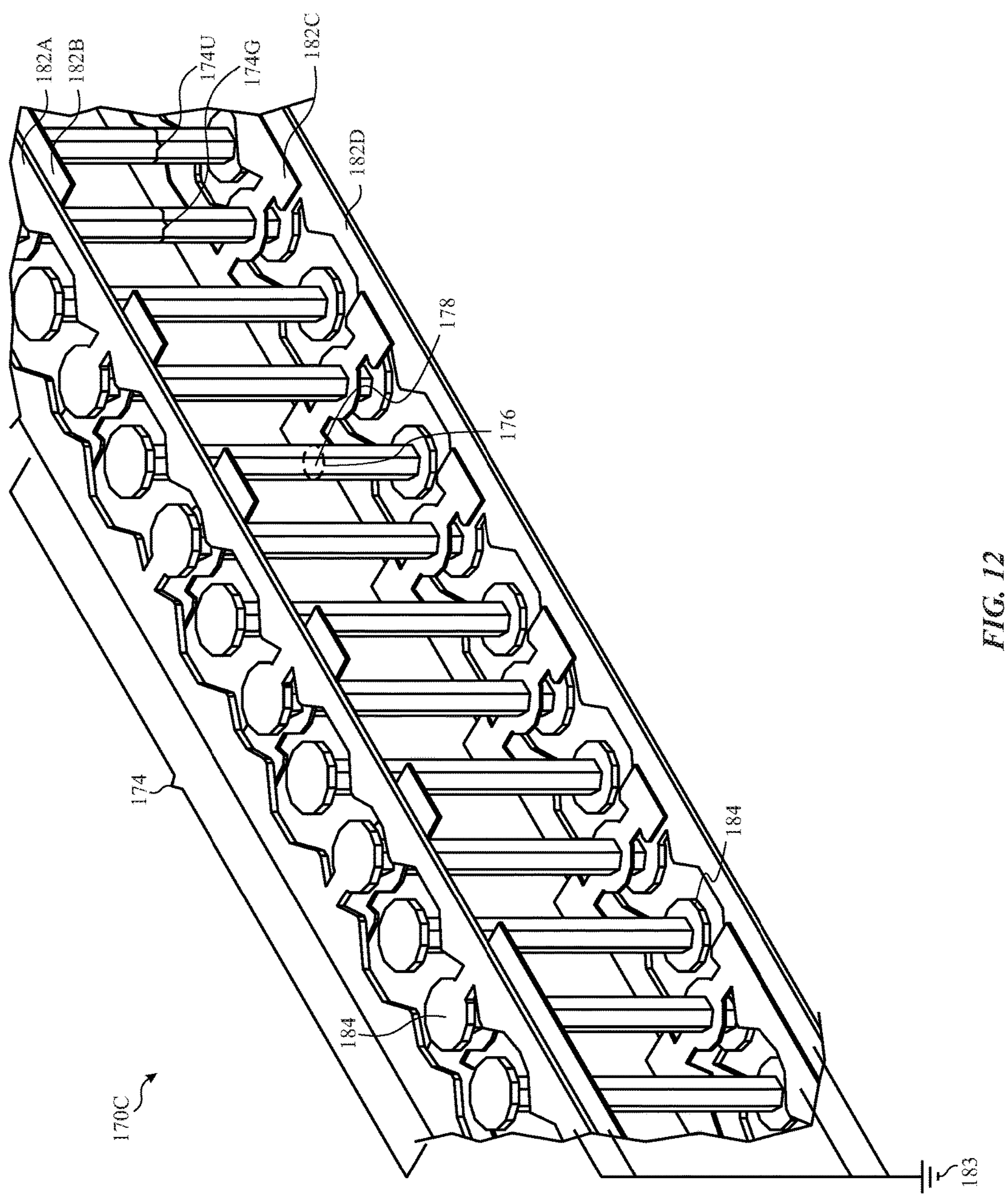
FIG. 12 is a perspective view of vias of the interposer of FIG. 9A, in accordance with a third embodiment.
Figure 13:
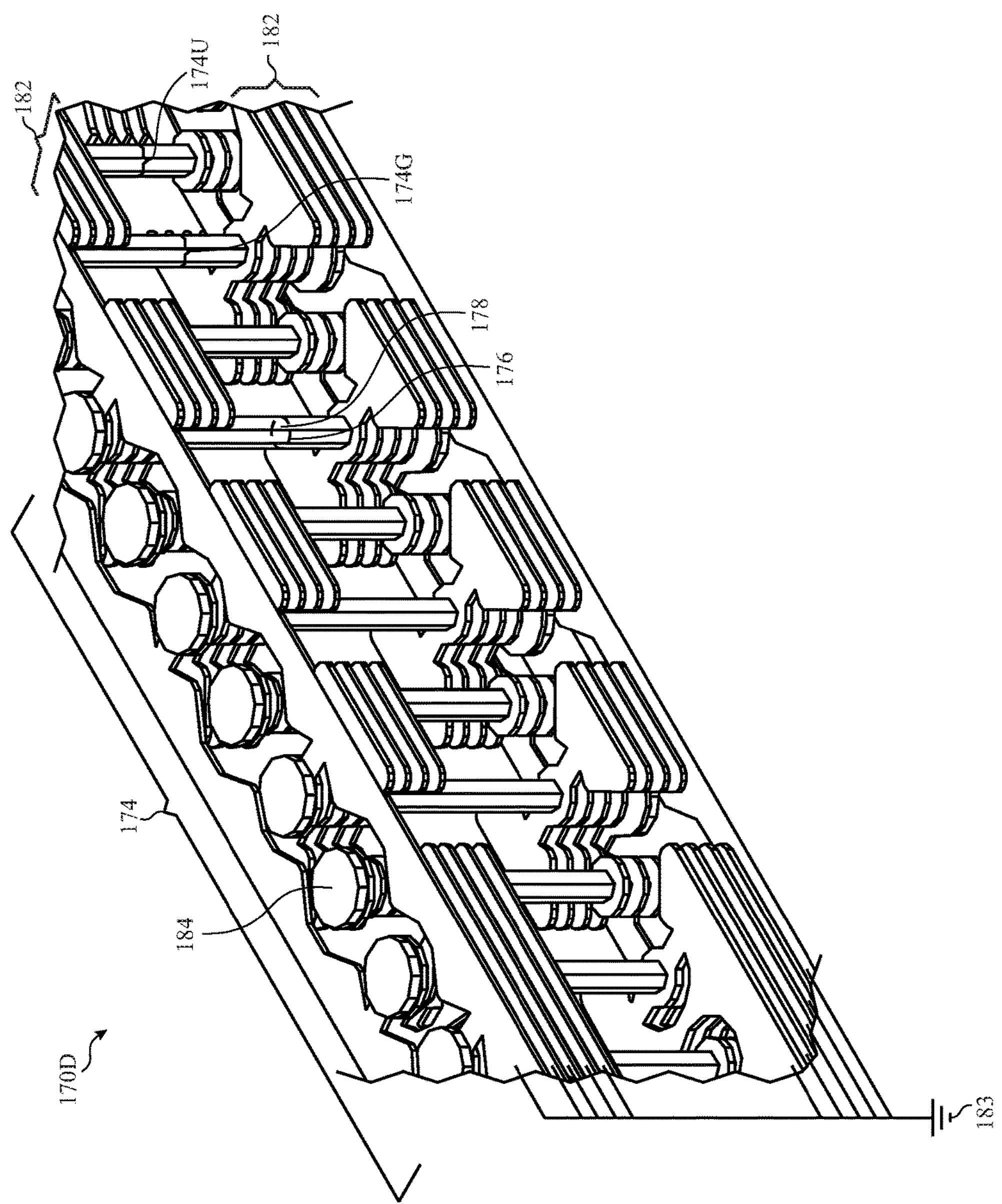
FIG. 13 is a perspective view of vias of the interposer of FIG. 9A, in accordance with a fourth embodiment.

FIG. 12 and FIG. 13 show two embodiments of the interposer 170 that change a number of grounded layers 182 from two layers to four layers (e.g., as in FIG. 12) or ten layers (e.g., as in FIG. 13). FIG. 12 is a perspective view of a third embodiment of the interposer 170. As depicted, the interposer 170 includes four grounded layers 182A, 182B, 182C, and 182D. Increasing the number of grounded layers 182 from two layers (e.g., as depicted in FIG. 10 and FIG. 11) to four layers may act to provide better ground coverage along the length of the RF vias 174 by coupling a larger amount of the grounded RF vias 174G with surrounding grounded layers 182. Increasing the number of grounded layers 182 may further cause the RF vias 174 to imitate a coaxial transmission line structure.

Any number of layers may be added to the interposer 170 to further isolate the ungrounded RF vias 174U. For example, the interposer 170 may include ten grounded layers 182, as shown in FIG. 13, which illustrates of a fourth embodiment of the interposer 170. The interposer 170 of FIG. 13 includes ten grounded layers 182, acting to further isolate the ungrounded RF vias 174U. The interposer 170 may include any suitable number of layers of any suitable thickness. In some embodiments, increasing the number of grounded layers 182 may increase a parasitic capacitance 198 associated with the grounded layers 182 and serves as an example of a design trade-off that may exist as design parameters change. The parasitic capacitances 198 increase as the number of layers increases because as dimensions of conducting parallel plates of a capacitor increase (e.g., increased width from additional layers of grounded layers 182), the capacitance increases.

Figure 14:
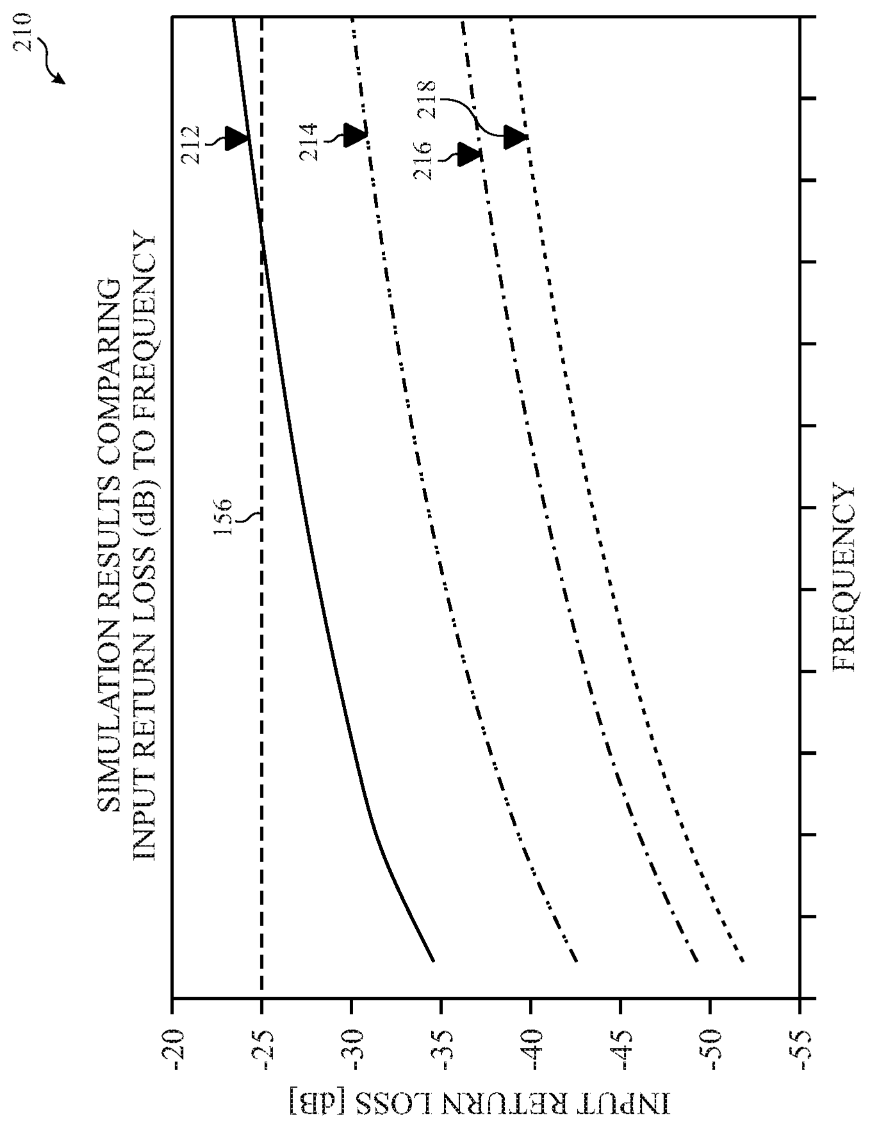
FIG. 14 is a graph comparing how simulated increases in frequency of a RF signal affect an input return loss level of different embodiments of the interposer of FIG. 9A.
Figure 15:
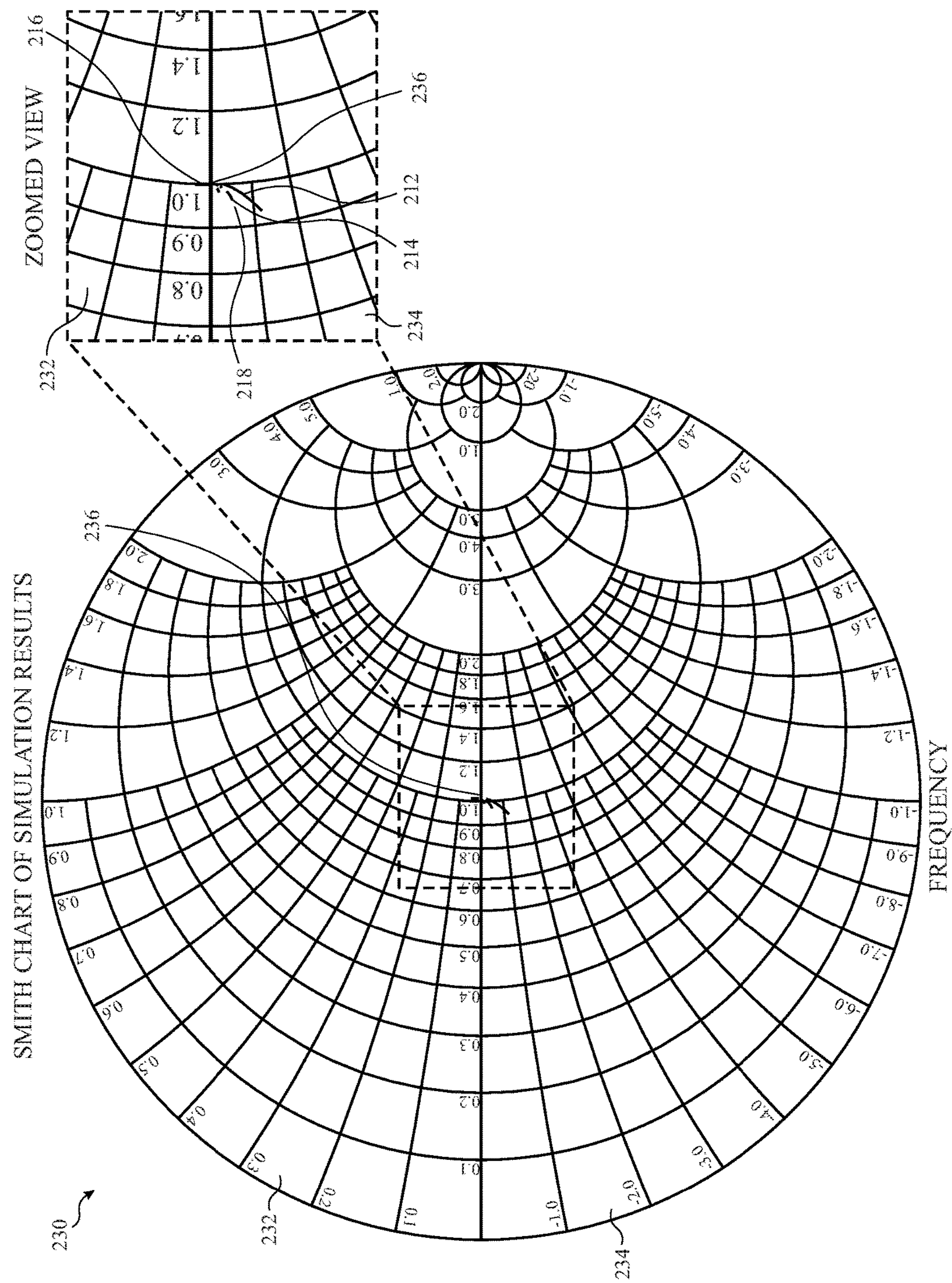
FIG. 15 is a graph comparing simulated impedance characteristics of different embodiments of the interposer of FIG. 9A.

With the variety of design factors contributing to selecting a design of the interposer 170, determining an appropriate number of layers, an appropriate interposer 170 design, and/or an appropriate RF via 174 design may include comparing simulations of the design variations. Performance simulations may help differentiate between the one or more designs to facilitate selection of an interposer 170 design (e.g., a design parameter combination). FIG. 14 and FIG. 15 show simulation scenarios and comparative performances between the simulation scenarios. It is noted that an appropriate design may be determined on a per-embodiment, or per-application, basis, and any suitable method of determination may determine an appropriate design for an application.

FIG. 14 is a graph 210 comparing how simulated increases in frequency of a RF signal affect an input return loss associated with the different interposer 170 designs, described above. The graph 210 compares simulation results for interposer 170B designs having two grounded layers 182 and interposer 170C designs having four grounded layers 182. In the simulation, the interposer 170 designs varied in values for the material constant 204, for the via diameter 200, and for the number of grounded layers 182 to achieve a matching characteristic impedance.

Curve 212 corresponds to a first design of the interposer 170B1 using a first material having a first value for the material constant 204 (e.g., standard FR4 PCB that includes an epoxy laminate material having a dielectric constant of approximately 4.5), two grounded layers 182, and 250 μm diameter 200 vias 174. Curve 214 corresponds to a first design of the interposer 170C1 using the first material having the first value for the material constant 204, four grounded layers 182, and 200 μm diameter 200 vias 174. Curve 216 corresponds to a second design of the interposer 170B2 design using a second material having a second value for the material constant 204 (e.g., a low-Dk, a low dielectric constant material having a dielectric constant in the approximate range of 3.4-3.6), two grounded layers 182, and 200 μm diameter 200 vias 174. Curve 218 corresponds to a second design of the interposer 170C2 using the second material having the second value for the material constant 204, four grounded layers 182, and 200 μm diameter 200 vias 174.

For the simulation, transmission characteristics of the designs were tested by simulating various RF signal transmission frequencies to compare input return loss for the different designs. Analyzing simulations may include using one or more metrics to evaluate performance. As is depicted in FIG. 14, the level 156 is the metric for evaluating performance and represents a target input return loss level for the design to satisfy. To determine an appropriate interposer 170 design, simulation results, like the curves 212, 214, 216, and 218, may be compared against the level 156. In some embodiments, an appropriate design is an interposer 170 design that minimizes the input return loss.

In this simulation, the curves 212, 214, 216, and 218 are compared against the level 156. From this analysis of performances, the curve 218 is the furthest below the level 156 and appears to correspond to the most appropriate design, relative to the other curves, because the curve 218 appears to minimize an input return loss level. In some embodiments, additional metrics may be considered when determining an appropriate design from several simulated designs, for example, impedance characteristics of a RF via 174 design associated with the interposer 170 designs. Thus, while the curve 218 may appear to correspond to the most appropriate design, different metrics, such as impedance characteristics of a design, may refine or change a determination of an appropriate design. For example, an appropriate design may balance the target input return loss level while having an impedance characteristic that is capacitive.

FIG. 15 helps to illustrate an example of an additional evaluation metric of the curves 212, 214, 216, and 218 of FIG. 14. Graph 230 compares simulated impedance characteristics of the interposer 170B and 170C designs via plotting curves 212, 214, 216, and 218. The graph 230 is a Smith chart and may facilitate in the identification of impedance characteristics of a RF via 174 design and/or an interposer 170 design. On a Smith chart, a first portion 232 represents capacitive characteristics and a second portion 234 represents inductive characteristics. Thus, plotting interposer 170 design impedance characteristics onto a Smith chart may facilitate in identifying an overall capacitive characteristic and/or an overall inductive characteristic of the interposer 170 design.

Furthermore, a Smith chart may enable the plotting of impedance characteristics corresponding to one or more interposer 170 designs to facilitate comparison of multiple designs. When comparing the one or more interposer 170 designs, an interposer 170 is identified as more capacitive if the plotting of the interposer 170 design extends relatively further (e.g., relative to the other designs) into the first portion 132 and more inductive if the plotting extends relatively further into the second portion 234. Furthermore, an interposer 170 design may be considered balanced if the design is positioned at origin 236 and does not extend and/or minimally extends into the first portion 232 and/or the second portion 234. As depicted, the curve 212 is the most inductive of the curves 212, 214, 216, and 218, and the curve 216 is the most capacitive of the curves 212, 214, 216, and 218.

Impedance characteristics of an interposer 170 design may facilitate in selecting an appropriate design because an interposer 170 may be selected to offset a RF transmission system impedance characteristic (e.g., impedance characteristics of the electronic device 10). To elaborate, if the RF transmission system was predominantly inductive, to properly balance out the RF transmission system impedance, an interposer 170 design that has a matching characteristic impedance in addition to a counteracting impedance characteristic (e.g., to counteract RF transmission system impedance) may be the most appropriate design. For example, the curves 212, 214, 216, and 218 may correspond to an interposer 170 design having a matching characteristic impedance of 50Ω but the RF transmission system may be slightly capacitive, thus an interposer 170 design that is slightly inductive (e.g., as corresponding to the curves 218, 214, and 212) may be the more appropriate design to select to further balance RF transmission system characteristics. Thus, a combination of simulations and performance metrics may help determine the appropriate interposer 170 design for a RF transmission system.

Thus, the technical effects of the present disclosure include techniques for transmitting RF signals from processing components to power components, for example, by improving via design to support efficient transmission of RF signals. The techniques include considerations for RF via design and/or interposer design, variations of the RF via design and/or interposer design, and techniques for selecting an appropriate interposer design based on RF transmission system characteristics.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device, comprising:

a first circuit board;

a second circuit board;

processing circuitry having a first impedance and being configured to generate radio frequency signals, wherein the processing circuitry is configured to couple to the first circuit board;

power circuitry having a second impedance and being configured to amplify the radio frequency signals, wherein the power circuitry is configured to couple to the second circuit board; and an interposer disposed between the first circuit board and the second circuit board, wherein the interposer comprises a via structure coupling the processing circuitry to the power circuitry and having a characteristic impedance configured to match the first and second impedances, and wherein the via structure is configured to transmit the radio frequency signals through the interposer between the processing circuitry and the power circuitry.

2. The electronic device of claim 1, wherein the via structure is configured to have about a 50 ohm [Ω] characteristic impedance.

3. The electronic device of claim 1, wherein the via structure comprises:

an ungrounded via, wherein the ungrounded via is configured to transmit the radio frequency signals from the processing circuitry to the power circuitry; and a first grounded via disposed adjacent to the ungrounded via, wherein the first grounded via is configured to shield the radio frequency signals from signal interference during transmission.

4. The electronic device of claim 3, wherein the via structure is configured to have a particular characteristic impedance value based at least in part on a diameter of the ungrounded via, a distance from the ungrounded via to the first grounded via, and a material constant of the interposer.

5. The electronic device of claim 3, wherein the via structure comprises a second grounded via disposed adjacent to the ungrounded via, wherein the ungrounded via is disposed between the first grounded via and the second grounded via.

6. The electronic device of claim 1, wherein the via structure comprises one or more vias that are coated or filled with copper.

7. The electronic device of claim 1, wherein the via structure comprises two or more conductive layers configured to couple to a circuit ground and a plurality of vias configured to couple to the two or more conductive layers.

8. A stacked printed circuit board (PCB) assembly, comprising:

a first PCB;

a second PCB; and an interposer disposed between the first PCB and the second PCB, wherein the interposer has a via structure having a characteristic impedance configured to match a one or more impedances associated with the first PCB and the second PCB, wherein the via structure comprises:

a first via configured to couple to a circuit ground;

a second via disposed adjacent to the first via, wherein the second via is configured to transmit radio frequency signals between the first PCB and the second PCB, and wherein the first via is configured to shield the radio frequency signals from signal interference during transmission; and a third via disposed adjacent to the second via, wherein the third via is configured to couple to the circuit ground and shield the radio frequency signals from signal interference during transmission.

9. The stacked PCB assembly of claim 8, wherein the first via comprises a conductor and at least one grounded layer configured to couple to the conductor and to the circuit ground.

10. The stacked PCB assembly of claim 8, wherein the characteristic impedance is based at least in part on a dielectric material of the interposer, a diameter of the second via, or a distance from the second via to the circuit ground, or any combination thereof.

11. The stacked PCB assembly of claim 8, wherein the first via and the second via are coated or filled with a conductive material.

12. The stacked PCB assembly of claim 8, wherein the via structure comprises:

a first conductive layer configured to couple to the circuit ground; and a second conductive layer configured to couple to the circuit ground, wherein the first via, the second via, the third via, the first conductive layer, and the second conductive layer are configured to approximate a coaxial transmission line having the characteristic impedance.

13. The stacked PCB assembly of claim 12, wherein the via structure comprises one or more additional conductive layers respectively configured to couple to the circuit ground, wherein the one or more additional conductive layers are respectively configured to couple to the first via and the third via.

14. The stacked PCB assembly of claim 12, wherein the second via is disposed between the first via and the third via.

15. An interposer structure, comprising:

a substrate comprising a dielectric material and being configured to couple between a first printed circuit board (PCB) and a second PCB;

a first via formed in the substrate;

a second via formed in the substrate;

a third via formed in the substrate adjacent to and between the first via and the second via, wherein the third via is configured to transmit radio frequency signals between the first PCB and the second PCB; and a conductive layer configured to couple the first via and the second via to a circuit ground, wherein the first via and the second via are configured to shield the radio frequency signals of the third via from signal interference.

16. The interposer structure of claim 15, wherein the first via, the second via, and the third via are configured to approximate a coaxial line.

17. The interposer structure of claim 16, wherein the approximated coaxial line comprises a characteristic impedance, and wherein the characteristic impedance is determined based at least in part on:

$$Z_o = 60\sqrt{\frac{\mu_r}{\varepsilon_r}}\ln\left(\frac{2G}{D}\right)$$

where $Z_o$ is the characteristic impedance, D is a diameter of the third via, G is a distance from the conductive layer to a center axis of the third via, $\mu_r$ is a magnetic permeability of the dielectric material, and $\varepsilon_r$ is a relative permittivity of the dielectric material.

18. The interposer structure of claim 17, wherein the characteristic impedance is configured to match an impedance associated with circuitry disposed on the first PCB and the second PCB.

19. The interposer structure of claim 15, wherein the first via, the second via, and the third via each comprise a conductive filling or coating.

* * * * *